United States Patent [19]
Luckett

[11] Patent Number: 5,581,561
[45] Date of Patent: Dec. 3, 1996

[54] RANDOM BIT DIAGNOSTIC FOR A HIGH RESOLUTION MEASUREMENT SYSTEM

[75] Inventor: Lawane J. Luckett, Richardson, Tex.

[73] Assignee: Texas Instruments Incorporated, Dallas, Tex.

[21] Appl. No.: 350,562

[22] Filed: Dec. 7, 1994

[51] Int. Cl.⁶ .................................................. H03M 13/00
[52] U.S. Cl. .................................................................. 371/6
[58] Field of Search ........................... 371/6, 22.1, 22.2, 371/61, 25.1; 324/73.1; 239/303

[56] References Cited

U.S. PATENT DOCUMENTS 4,432,243  2/1984  Lowell et al. ..................... 73/861.31
4,617,662  10/1986  Auer, Jr. et al. ....................... 371/25
5,025,205  6/1991  Mydill et al. ........................ 324/73.1

*Primary Examiner*—Robert W. Beausoliel, Jr.
*Assistant Examiner*—Phung Chung
*Attorney, Agent, or Firm*—W. Daniel Swayze, Jr.; W. James Brady, III; Richard L. Donaldson

[57] ABSTRACT

An apparatus determines if a bit of a word is stuck or unchanging. The apparatus inputs test words to be tested, a zero word indicating that all bits have been turned off and a ones word to indicate that all bits have been turned on. A series of logical AND and logical OR operation with the zero word and the ones word and an exclusive OR operation determines if the bit is unchanging.

10 Claims, 1 Drawing Sheet

RANDOM BIT DIAGNOSTIC FOR A HIGH RESOLUTION MEASUREMENT SYSTEM

TECHNICAL FIELD OF THE INVENTION

The present invention relates to a method and apparatus for determining or identifying particular bits which have been stuck or produce the same reading over an extended period of time, despite that these bits have been instructed to change. More particularly, the present invention relates to a method and apparatus for determining whether bits have been stuck or remain the same over an extended period of time for use associated with a high resolution measurement systems, for example a Time Measurement Unit (TMU).

BACKGROUND OF THE INVENTION

Time Measurement Units are used to measure the time between two waveform signals. The time between two waveform signals are useful in that this information can be used in various ways. In U.S. Pat. No. 4,432,243 to Lowell, for example, a Time Measurement Unit measures the timing of signals transmitted by a transmitter and received by a receiver, and the Time Measurement Unit in turn converts the signals to flow measurements by a processing unit.

It can be appreciated that as the requirements for increased accuracy in these types of timing signals with the Time Measurement Unit is increased, the need for more accurate information relating to the time between waveform signals is required.

A problem arises particularly in the area of digital signal processing in that the bits of words which are used for the readings of the time measurement unit are important. As the need for accuracy increases, the need for each bit of the word, particularly the low order bits, used to obtain the readings is becoming increasingly important.

In digital processing, the magnitude of the signal is usually represented in either a word or double word of computer memory, register bits or the like. These signals may initially be input as an analog signal and subsequently converted to digital signals as they are represented in the word or double word by a series of bits where each bit represents a number. The bit differs from an adjacent bit in the number that the bit represents is different; the bits usually differ by a power of a convenient base, usually two.

In most circumstances, the digital value of the waveform signal has sufficient number of bits so that the desired accuracy in the representation of waveform signal can be achieved. In these cases, the high order bits correspond approximately to the magnitude of the signal waveform while the low order bits provide a relatively smaller contribution to the magnitude of the waveform. Consequently, if the high order bits of the word or double word used for the digital value are stuck and not responding to changing readings for the digital, it is very apparent that these bits are stuck since these bits provide a major contribution to the magnitude of the signal waveform. Consequently, it is relatively easy to determine which of these high order bits are stuck or not responding to the changing digital values of the waveform signal.

In contrast, while the low order bits may provide little relative contribution to the total magnitude of the waveform signal, these low order bits are becoming increasingly important as the accuracy of the magnitude of the digital waveform of the signal waveform is increased. However, it is increasingly difficult to detect a stuck or non-responding bit to changing readings of the low order bits of the signal waveform since these bits provide a relatively small contribution to the magnitude of the waveform. Thus, when these bits are stuck, little change in magnitude is observed.

SUMMARY OF THE INVENTION

The present invention provides an apparatus and method to detect and identify which bit or bits that are not responding to an input reading of the signal waveform.

The present invention provides through either hardware or software which may or may not be performed on a CPU, an apparatus and method for determining if bits particularly a low order or least significant bits are stuck or do not respond to a changing reading.

The present invention also includes an apparatus for determining if a bit of a word is unchanging, including an input device to input a plurality of test words to be tested and to input a zero word to indicate that no bits in the zero word have been turned on and an ones word to indicate that all bits in the ones word have been turned on; coupled to the input device an OR device to perform logical OR operation on a test word of the test words to be tested and the zero word having no bits in the zero word turned on and to output an ORed word as a result of the logical OR operation; an AND device coupled to the input device to perform a logical AND operation on the test word to be tested and the ones word having all bits in the ones word turned on and to output an ANDed word as a result of the logical AND operation; coupled to the OR device and the AND device an XOR device to perform a logical exclusive OR operation on the ORed word and the ANDed word and to form an indication of the unchanging bit.

The present invention also includes an additional OR device coupled to the OR device to perform logical OR operation on another test word of the test words and the ORed word and to output another ORed word as a result of the logical OR operation.

The present invention includes a further OR device coupled to the additional OR device to perform OR operation on a further test word of the test words and the another ORed word to output a further ORed word as a result of the logical OR operation.

The present invention also includes an additional AND device coupled to the AND device to perform AND operation on another test word of the test words and the ANDed word and to output another ANDed word as a result of the logical AND operation.

The present invention also includes a further AND device coupled to the additional AND device to perform AND operation on a further test word of the test words and the other ANDed word and to output a further ANDed word as a result of said logical AND operation.

DETAILED DESCRIPTION OF THE INVENTION

Although the present invention has been described in terms of detecting low order bits which may have been stuck, it is to be understood that the present invention can be applied equally to either the high order bits or the low order bits. The detection of the low order bits is used as an example since the low order bits, which may be stuck or do not respond to the readings of the waveform signal, are not easily detected since the relative contribution of these low order bits with respect to the high order bits to the representation of the waveform signal is normally small. The present invention attains successive readings from the input waveform signal and concurrently performs logical "OR" "AND" operations and then performs an XOR operation of the output of the last "OR" "AND" operation. The logical "OR" and logical "AND" operations may be performed in parallel or may be performed one after sequentially.

Figure 1:
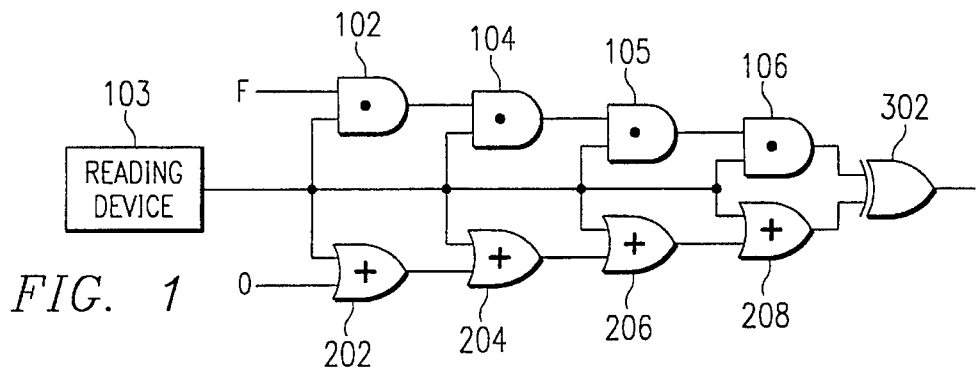
FIG. 1 illustrates a circuit diagram of the present invention.

FIG. 1 illustrates a reading device 103 to obtain digital readings of a waveform signal. The first reading from a reading device 103 and hexadecimal F are input to AND gate 102. The output of AND gate 102 is input to AND gate 104 with a second reading output from reading device 103. The output of the AND gate 104 is input with a third reading output from reading device 103 to AND gate 105. The output of AND gate 105 is input with a fourth reading output from the reading device 103 to AND gate 106. The output of the AND gate 106 is input to the exclusive OR gate 302. The first reading is additionally input to the OR gate 202 with the hexadecimal 0. The output of the OR gate 202 is input with the second reading to the OR gate 204. The output of the OR gate 204 is input with the third reading to the OR gate 206. The output of the OR gate 206 is input with the fourth reading to the OR gate 208. The output of the OR gate 208 is input to the exclusive OR gate 302.

The following example illustrates the results of the above apparatus and procedure.

EXAMPLE: Five 4-bit binary readings are taken.
(hex 5,1,8,4)

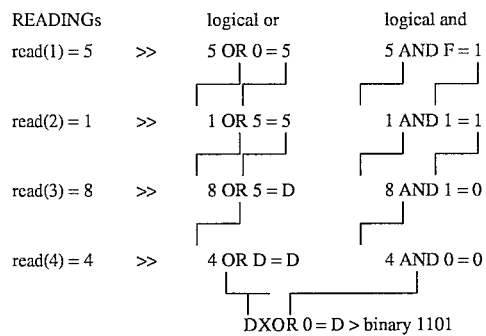

Example 1 illustrates the operation of the logical OR gates and logical AND gates. The four successive readings are hexadecimal 5, hexadecimal 1, and hexadecimal 8, and hexadecimal 4.

In operation, a hexadecimal 5 output from the reading device 103 and a hexadecimal F is input to the AND gate 102 outputting a hexadecimal 5 to be input to AND gate 104. A hexadecimal 1 output from the reading device is additionally input into AND gate 104, which outputs a hexadecimal 1. The hexadecimal 1 output from AND gate 104 and a hexadecimal 8 output from the reading device 103 is input to the AND gate 105 to output a hexadecimal 0. A hexadecimal 4 output from the reading device 103 and the hexadecimal 0 output from the AND gate 105 are input to AND gate 106 to output a hexadecimal 0.

Correspondingly, a hexadecimal 5 output from the reading device 103 and a hexadecimal 0 is input to OR gate 202 to output a hexadecimal 5. The hexadecimal 5 output from the OR gate 202 is input with a hexadecimal 1 output from the reading device 103 to the OR gate 204. A hexadecimal 5 is output from OR gate 204 with a hexadecimal 8 output from the reading device 103 to OR gate 206 to output a hexadecimal D. The hexadecimal D output from the OR gate 206 and hexadecimal 4 output from the reading device 103 is input to the OR gate 208. The output of the OR gate 208 is a hexadecimal D. A hexadecimal D output from the OR gate 208 and hexadecimal 0 output from the AND gate 106 is input XOR gate 302 which exclusively ORed the inputs to output a hexadecimal 0 which is a binary 1101. This indicates that a second to the lowest bit is stuck at 0. As the number of readings increase of the above-mentioned process, the statistical confidence that a bit is in fact stuck increases. For example, with one reading, the statistical confidence is 50/50 that a bit is stuck and correctly detected as stuck. With two readings, the statistical confidence is 0.5×0.5 or 0.25. Thus, as it can be very clearly seen with only two readings, the statistical confidence decreases to 0.25. Correspondingly, increasing the number of readings, correspondingly increases the probability that the bit is in fact stuck assuming random probability without biasing the input readings.

Figure 2:
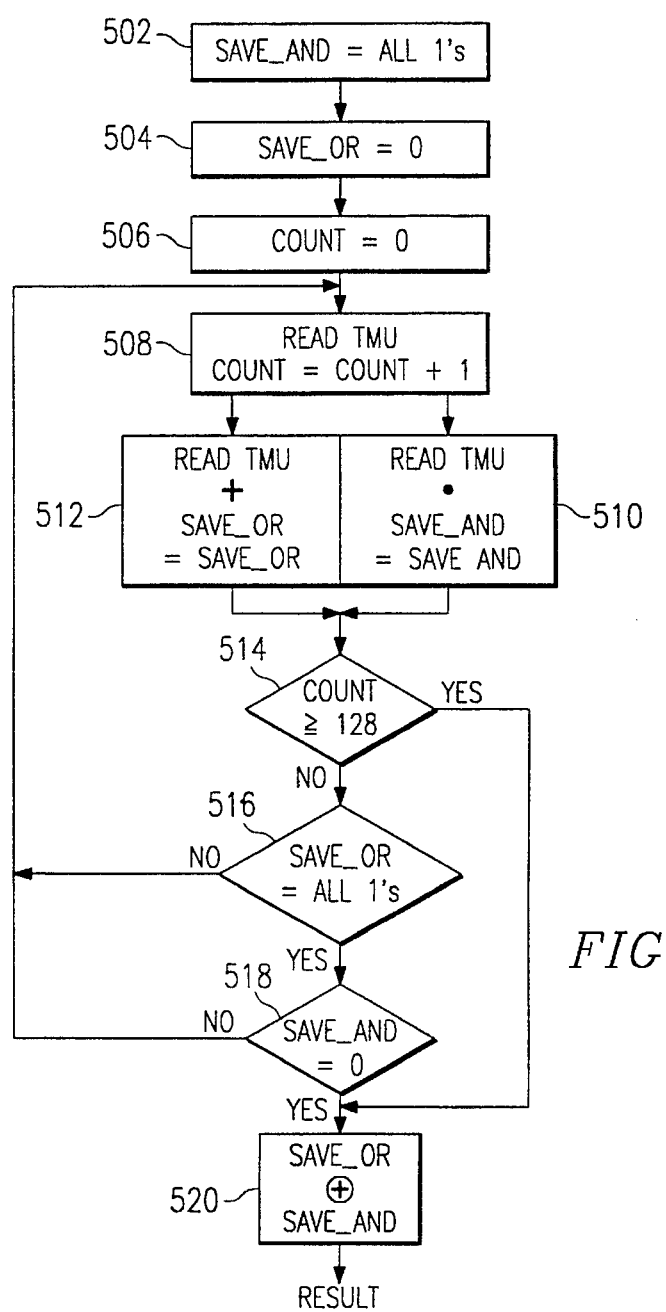
FIG. 2 illustrates a flowchart of the present invention.

FIG. 2 illustrates a flowchart of a present invention. These steps may be executed by software such as enclosed in the appendix on a computer, a minicomputer or microprocessor in order to obtain the same results.

In block 502, the variable save_and is set to all binary ones. In block 504, the variable save_or is set to all binary zeros. In block 506, the variable count is set to 0. In block 508, the TMU is read to determine a read value. Blocks 510 and 512 may be either determined sequentially or in parallel. The read value from the TMU is ORed with the save_or and the save_or variable is updated with the result of the operation of Block 512. In block 510 the variable save_and is ANDed with the read value from the TMU and the save_and is updated with the result of the AND operation of the program.

In block 514, the count is tested to determine if it exceeds 128, an arbitrary predetermined limit. If it does, the save_or variable is exclusively ORed with the save_and variable in block 520. If the count is less than 128, the predetermined limit, the save_or is compared with a constant of all logical ones. If they are equal, block 518 is executed. In block 518, the save_and is compared with a constant of all binary zeros. If they are not equal, block 508 is executed, otherwise block 520 is executed. The result from block 520 provides an indication of the bit which has been stuck or does not respond to the change in readings of the waveform signal.

The following is an example of code to perform the above functions.

```
************************************************************************
SUBROUTINE ANA_BITS
  * check bits on analog ramp 1 lower 8 bits are random check,
  * and & or then xor to see what bits changed
  *
```

```
     LET ANA1_SAVE_OR = 0
     LET ANA1_SAVE_AND = >FF
     LET ANA2_SAVE_OR = 0
     LET ANA2_SAVE_AND = >FF
     *
     GOSUB PRINT_MENU(4)
     PRINT .CR(14)
     PRINT .CURSOR(8,5), 'TAKE TMU MEASUREMENTS AND .OR & .AND
THE READINGS',.NCR
     PRINT .CURSOR(9,5), 'TOGETHER TO DETERMINE NON CHANGING
BITS.', .NCR
     PRINT .CURSOR(12,5), 'RAMP', .TAB(15),'ORed VALUE', .NCR
     PRINT .TAB(30), 'ANDed VALUE', .TAB(46), 'BITS', .NCR
     PRINT .TAB(60), 'STATUS', .NCR
     *
     LET LOOP = 0
     CALL READ_KEY(K$)                        ; flush keyboard buffer
     REPEAT
        LET .pic(TMU_ADDR,TMU_CAL1_LT_ADDR) = 127 - LOOP
        TMU (>50,6,0)                         ; setup matrix to clk_tmu
        *
        LET READ1 = .pic(TMU_ADDR,RD_TMU1_ANA_ADDR) .AND >FF
        LET ANA1_SAVE_OR = ANA1_SAVE_OR .OR READ1
        LET ANA1_SAVE_AND = ANA1_SAVE_AND .AND READ1
        *
        PRINT .CURSOR(13,5), '1', .TAB(15), .HEX(1,4), ANA1_SAVE_or, .NCR
        PRINT .TAB(30), .HEX(1,4), ANA1_SAVE_and, .NCR
        LET LOOP = LOOP + 1
        LET EXIT_LOOP = 0
        IF (ANA1_SAVE_AND .EQ >0) .AND (ANA1_SAVE_OR .EQ >FF)
           LET EXIT_LOOP = 1
        ENDIF
        LET CHG_TEST = 0
        IF (K$ .EQ 'RN') .OR (K$ .EQ 'P') .OR (.ESC .EQ 1)
           LET CHG_TEST = 1
        ENDIF
     UNTIL (LOOP .GE 128) .OR CHG_TEST .OR EXIT_LOOP
     *
     LET LOOP = 0
     CALL READ_KEY(K$)                        ; flush keyboard buffer
     REPEAT
        LET .pic(TMU_ADDR,TMU_CAL2_LT_ADDR) = (127 - LOOP) * >100
        TMU (>50,6,0)                         ; setup matrix to clk_tmu
        *
        LET READ2 = .pic(TMU_ADDR,RD_TMU2_ANA_ADDR) .AND >FF
        LET ANA2_SAVE_OR = ANA2_SAVE_OR .OR READ2
        LET ANA2_SAVE_AND = ANA2_SAVE_AND .AND READ2
        *
        PRINT .CURSOR(15,5), '2', .TAB(15), .HEX(1,4), ANA2_SAVE_or, .NCR
        PRINT .TAB(30), .HEX(1,4), ANA2_SAVE_and, .NCR
        LET LOOP = LOOP + 1
        LET EXIT_LOOP = 0
        IF (ANA2_SAVE_AND .EQ >0) .AND (ANA2_SAVE_OR .EQ >FF)
           LET EXIT_LOOP = 1
        ENDIF
        LET CHG_TEST = 0
        IF (K$ .EQ 'RN') .OR (K$ .EQ 'P') .OR (.ESC .EQ 1)
           LET CHG_TEST = 1
        ENDIF
     UNTIL (LOOP .GE 128) .OR CHG_TEST .OR EXIT_LOOP
     *
     LET ANA1_SAVE = ANA1_SAVE_OR .XOR ANA1_SAVE_AND
     LET ANA2_SAVE = ANA2_SAVE_OR .XOR ANA2_SAVE_AND
     IF ANA1_SAVE .EQ >FF
        LET STR$(1) = 'TMU1 ALL BITS CHANGED'
        LET STR$(3) = ''
     ELSE
        LET STR$(1) = 'THIS BIT DID NOT CHANGE '
        LET STR$(3) = 'TMU1 RANDOM TEST MAY NOT BE CONCLUSIVE BUT,'
     ENDIF
     IF ANA2_SAVE .EQ >FF
        LET STR$(2) = 'TMU2 ALL BITS CHANGED'
        LET STR$(4) = ''
     ELSE
        LET STR$(2) = 'THIS BIT DID NOT CHANGE '
        LET STR$(4) = 'TMU2 RANDOM TEST MAY NOT BE CONCLUSIVE BUT,'
     ENDIF
     PRINT .CURSOR(13,45), .HEX(1,4), ANA1_SAVE, .TAB(55), STR$(1), .NCR
     PRINT .CURSOR(15,45), .HEX(1,4), ANA2_SAVE, .TAB(55), STR$(2), .NCR
     PRINT .CURSOR(20,20), STR$(3), .NCR
```

```
-continued
PRINT .CURSOR(21,20), STR$(4), .NCR
PRINT .CURSOR(24,1), .NCR
*
GOSUB PRINT_MENU(2)
REPEAT
  CALL READ_KEY(KS)
UNTIL (KS .EQ 'RN') .OR (K$ .EQ 'P') .OR (.ESC .EQ 1)
*
RETURN
*
******************************************************************************
```

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. An apparatus for determining if a bit of a word is unchanging, comprising:
   an input device to input a plurality of test words to be tested and to input a zero word to indicate that all bits in said zero word have been turned off and a ones word to indicate that all bits in said ones word have been turned on;
   an OR device coupled to said input device to perform a logical OR operation on a test word of said test words to be tested and said zero word having all bits in said zero word turned off and to output an ORed word as a result of said logical OR operation;
   an AND device coupled to said input device to perform a logical AND operation on said test word to be tested and said ones word having all bits in said one word have been turned on and to output an ANDed word as a result of said logical AND operation;
   an XOR device coupled to said OR device and said AND device to perform a logical exclusive operation on said ORed word and said ANDed word and to form an indication of the unchanging bit.

2. The apparatus as in claim 1, wherein said apparatus further comprises an additional OR device coupled to an output of said OR device to perform an additional logical OR operation on another test word of said test words and said ORed word and to output another ORed word as a result of said other logical OR operation.

3. The apparatus as in claim 2, wherein said apparatus further comprises a further OR device coupled to an output of said additional OR device to perform further logical OR operation on a further test word of said test words and said another ORed word to output a further ORed word as a result of said further logical OR operation.

4. The apparatus as in claim 1, wherein said apparatus further comprises an additional AND device coupled to an output of said AND device to perform an additional logical AND operation on another test word of said test words and said ANDed word and to output another ANDed word as a result of said additional logical AND operation.

5. The apparatus as in claim 4, wherein said apparatus further comprises an further AND device coupled to an output of said additional AND device to perform a further AND logical operation on a further test word of said test words and said other ANDed word and to output a further ANDed word as a result of said further logical AND operation.

6. A method for determining if a bit of a word is unchanging, comprising the steps of:
   inputting a plurality of words to be tested and inputting a zero word to indicate that all bits in said zero word have been turned off and a ones word to indicate that all bits in said one word have been turned on;
   performing a logical OR operation on a test word of said test words and said zero word indicating that all bits in said zero word have been turned off to form on ORed word as a result of said logical OR operation;
   performing a logical AND operation on said test word to be tested and said ones word having all bits in said word turned on and forming an ANDed word as a result of said logical AND operation; and
   performing a logical exclusive OR operation on said ORed word and said ANDed word to form an indication of the unchanging bit.

7. The method for determining if a bit of word is changing as in claim 6, wherein the method further comprises the step of:
   performing another logical OR operation on another test word of said test words and said ORed word to form another ORed word as a result of said another logical OR operation.

8. The method for determining if a bit of a word is changing as in claim 7, wherein the method further comprises the step of performing a further logical OR operation on a further test word of said test words and said another ORed word to form a further ORed word from said further logical OR operation.

9. The method for determining if a bit of a word is changing as in claim 6, wherein the method further comprises the step of performing an additional logical AND operation on another test word of said test words and said ANDed word to form another ANDed word from said additional logical AND operation.

10. The method for determining if a bit of a word is changing as in claim 9, wherein the method further comprises the step of performing a further logical AND operation on a further test word of said test words and said another ANDed word to form a further ANDed word for said further logical AND operation.

* * * * *